(12) United States Patent
Wang

(10) Patent No.: US 8,810,289 B1
(45) Date of Patent: Aug. 19, 2014

(54) DIGITAL POWER ON RESET

(75) Inventor: Yongjiang Wang, Austin, TX (US)

(73) Assignee: Marvell International Ltd. (BM)

( * ) Notice: Subject to any disclaimer, the term of this patent is extended or adjusted under 35 U.S.C. 154(b) by 0 days.

(21) Appl. No.: 13/490,731

(22) Filed: Jun. 7, 2012

Related U.S. Application Data

(63) Continuation of application No. 12/627,452, filed on Nov. 30, 2009, now Pat. No. 8,198,925.

(60) Provisional application No. 61/122,206, filed on Dec. 12, 2008.

(51) Int. Cl.
*H03L 7/00* (2006.01)

(52) U.S. Cl.
USPC ........... 327/142; 327/141; 327/143; 327/151; 327/160; 327/198; 377/107

(58) Field of Classification Search
USPC ................. 327/141, 142, 143, 151, 160, 198; 377/107
See application file for complete search history.

(56) References Cited

U.S. PATENT DOCUMENTS

| | | | |
|---|---|---|---|
| 5,648,766 A * | 7/1997 | Stengel et al. | 340/870.39 |
| 6,040,722 A | 3/2000 | Lee | |
| 6,278,302 B1 | 8/2001 | El-Kik | |
| 7,057,427 B2 | 6/2006 | Wadhwa et al. | |
| 7,148,755 B2 * | 12/2006 | Naffziger et al. | 331/16 |
| 7,348,815 B2 | 3/2008 | Chou | |
| 2003/0098733 A1 | 5/2003 | Saita | |
| 2005/0146385 A1 | 7/2005 | Johnson et al. | |
| 2007/0036017 A1 | 2/2007 | Seo | |
| 2009/0174444 A1 | 7/2009 | Dribinsky et al. | |
| 2009/0256597 A1 | 10/2009 | Har et al. | |

* cited by examiner

*Primary Examiner* — Arnold Kinkead
*Assistant Examiner* — Richard Tan

(57) ABSTRACT

Apparatuses, circuits, methods, and other embodiments associated with digital power on reset are described. In one embodiment, an apparatus includes a digital electronic component configured to produce a clock signal. A first counter is configured to output a first count signal based on the clock signal and a second counter is configured to output a second count signal based on the clock signal. A power on reset logic is configured to provide a power on reset signal based on the first count signal and the second count signal, where the power on reset logic is configured to disable the digital electronic component after providing the power on reset signal to prevent the digital electronic component from drawing power.

13 Claims, 5 Drawing Sheets

DIGITAL POWER ON RESET

CROSS REFERENCE TO RELATED APPLICATIONS

This disclosure is a continuation of U.S. Ser. No. 12/627,452 filed Nov. 30, 2009; now U.S. Pat. No. 8,198,925, which claims the benefit of U.S. provisional application Ser. No. 61/122,206, filed on Dec. 12, 2008, which are hereby wholly incorporated by reference.

BACKGROUND

Devices get turned on and off. When a device is turned on, power may not be instantaneously available to every component in the device. Even when power is available, it may not be available at a desired level for component operation. When a component on a device is an integrated circuit, it may be valuable to hold the integrated circuit in a reset condition until stable (e.g., fully ramped up) power is available at a desired level. Integrated circuits may be held in reset until they receive a power on reset signal from a power on reset circuit.

Traditional power on reset circuits are analog circuits that produce a constant power drain, even after performing their role in holding components in reset and then asserting a power on reset signal. A constant power drain is undesirable in a battery powered device. Traditional power on reset circuits can be difficult to port from device to device because different devices have different amounts of power available, have different power ramp characteristics, and/or consume different amounts of power during reset. For example, one device can have a power ramp measured in microseconds while another device has a power ramp measured in milliseconds.

FIG. 1 illustrates a power signal 100 that starts at a low level and that ramps up during a power ramp period 110. A power on reset signal 120 is held low during a power on reset delay time period 130. When a device is powered up, integrated circuits and/or other components on the device can be held in a reset state until power has ramped up to a desired state. The period of time for which the integrated circuits and/or other components are held in reset may vary. The exact time for which integrated circuits and/or other components are held in reset is generally not finely controllable and yet a device or devices still need to be held in reset for a minimum period of time. However, allowing a component to begin operations prematurely, (e.g., before power is in desired state), can have undesirable side effects.

Therefore, it would be desirable to have a power on circuit that does not produce a constant power drain and that can guarantee that at least a minimum time period elapses when a device is powered up to facilitate having components begin operations at a favorable time.

SUMMARY

An embodiment includes an apparatus comprising a digital electronic component configured to produce a clock signal. A first counter is configured to output a first count signal based on the clock signal and a second counter is configured to output a second count signal based on the clock signal. A power on reset logic is configured to provide a power on reset signal based on the first count signal and the second count signal, wherein the power on reset logic is configured to disable the digital electronic component after providing the power on reset signal to prevent the digital electronic component from drawing power.

Another embodiment includes a circuit comprising a digital electronic component configured to produce a clock signal, wherein the digital electronic component is connected to an input voltage. At least two counters are configured to output at least two count signals based on the clock signal. A power on reset logic is configured to provide a power on reset signal after the at least two count signals meet a pre-defined condition, wherein the power on reset logic is configured to disable the digital electronic component after providing the power on reset signal to prevent the digital electronic component from drawing power from the input voltage after the power on reset signal is provided.

Another embodiment provides a method that comprises generating a clock signal with a digital electronic component that is connected to an input voltage; outputting, using at least two counters, at least two count signals based on the clock signal; providing a power on reset signal after the at least two count signals meet a pre-defined condition; and disabling the digital electronic component after providing the power on reset signal to prevent the digital electronic component from drawing power from the input voltage after the power on reset signal is provided.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element can be designed as multiple elements or that multiple elements can be designed as one element. In some examples, an element shown as an internal component of another element can be implemented as an external component and vice versa. Furthermore, elements may not be drawn to scale.

DETAILED DESCRIPTION

Example apparatuses and methods concern a digital power on reset circuit. The digital power on reset circuit asserts a power on reset signal after an appropriate period of time and then becomes disabled. Since the circuit becomes disabled after performing its power on reset signal function, the circuit does not produce a constant power drain. This is unlike conventional analog systems that produce a constant power drain even after fulfilling their power on reset role. Example apparatuses and methods function to cause at least a desired amount of time to elapse between power coming on and the assertion of the power on reset signal. While the period of time before which the power on reset signal will be provided may vary, the period of time will be at least the desired amount of time. In one embodiment, the period of time may be user configurable. In one embodiment, the period of time can be controlled by counting clock cycles.

A clock signal is a particular type of signal that oscillates between a high and a low state. The clock signal can act like a metronome to coordinate actions of circuits that receive the clock signal. A clock signal is produced by a clock generator. Although various arrangements with various complexities are available, the most common clock signal takes the form of a square wave with a 50% duty cycle. The square wave usually has a fixed, constant frequency. Circuits using the clock signal for synchronization may become active at the rising edge, the falling edge, on both the rising and the falling edges of the clock cycle, and so on. The word signal is used herein to mean "transmitted energy that can carry information".

The following includes definitions of selected terms employed herein. The definitions include various examples and/or forms of components that fall within the scope of a term and that may be used for implementation. The examples are not intended to be limiting. Both singular and plural forms of terms may be used within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

Figure 1:
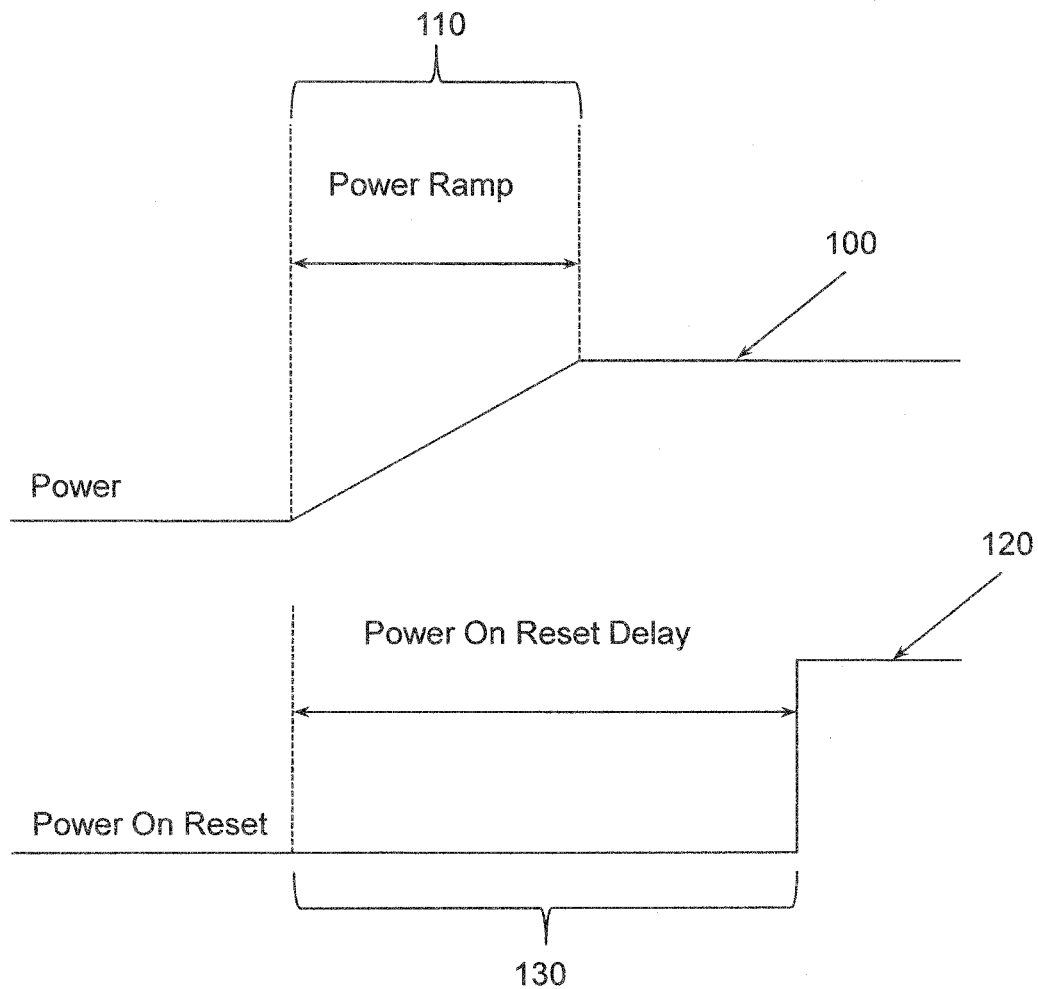
FIG. 1 illustrates a power on reset delay associated with a power ramp period.
Figure 2:
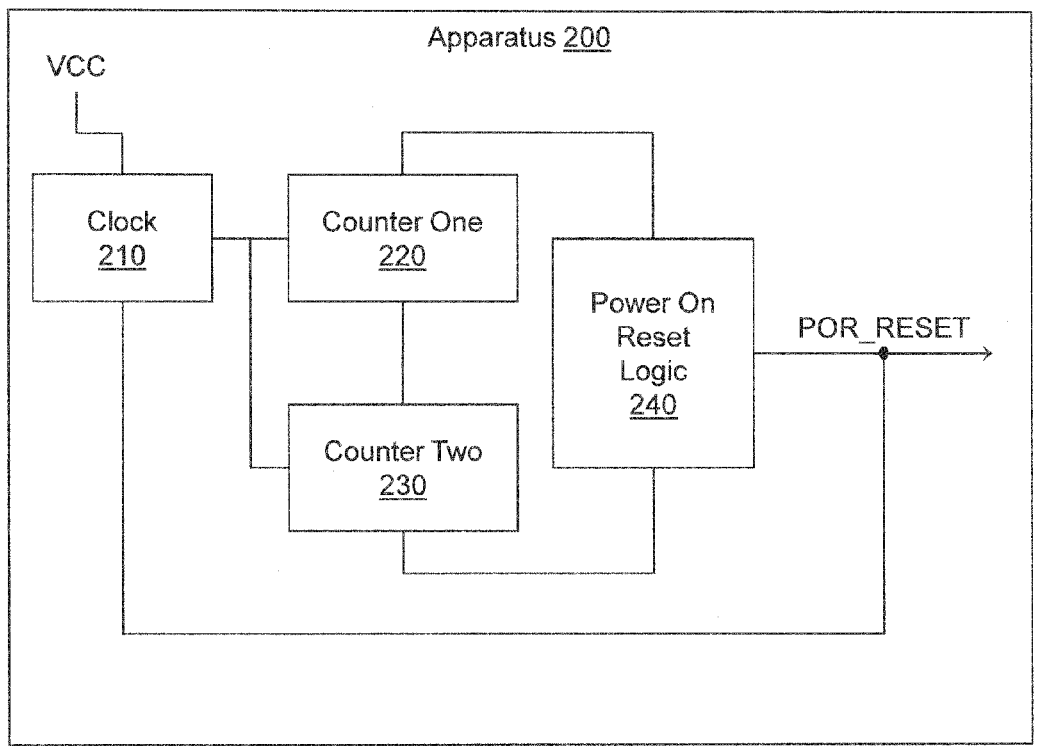
FIG. 2 illustrates a digital power on reset apparatus.

FIG. 2 illustrates a digital power on reset apparatus 200. Apparatus 200 includes a clock 210 that receives an input voltage (e.g., Vcc) and to produce an output clock signal suitable for clocking digital circuit components. More generally, the clock 210 is a digital electronic component that produces a clock signal. In one embodiment, the apparatus 200 is a digital electronic circuit.

Apparatus 200 also includes two counters, counter one 220 and counter two 230. While two counters are illustrated, one skilled in the art will appreciate that different embodiments can include two or more counters. Counter one 220 and counter two 230 to count identifiable elements (e.g., edges) in the clock signal from clock 210 and to provide outputs to a power on reset logic 240. More generally, the first counter 220 outputs a first count signal as a function of analyzing the clock signal and the second counter 230 outputs a second count signal as a function of analyzing the clock signal. In one embodiment the first counter 220 is a digital electronic component that counts clock edges in the clock signal. Similarly, the second counter 230 can be a digital electronic component that counts clock edges in the clock signal.

Power on reset logic 240 analyzes the inputs from the counters 220 and 230 and to selectively assert a power on reset signal (e.g., POR_RESET) at an appropriate time. Both counters 220 and 230 count, at the same time, based on the same input signal, and therefore there should be a known relationship between values for counters 220 and 230. Power on reset logic 240 also provides a feedback signal to clock 210. The feedback signal causes the clock 210 to turn off. More generally, the power on reset logic 240 selectively provides a power on reset signal as a function of the first count signal and the second count signal. The power on reset logic 240 also selectively disables the apparatus 200 upon providing the power on reset signal. The power on reset logic 240 selectively provides the power on reset signal upon determining that all of the following conditions have occurred in order: that the first counter 220 has counted to a first value, that the first counter 220 has reset the second counter 230 to a pre-determined value, that the first counter 220 has counted to a second value while the second counter 230 has counted up from the pre-determined value, and that the difference between the first counter 220 and the second counter 230 equals the pre-determined value at the point in time where the first counter 220 has counted to the second value.

In different embodiments, power on reset logic 240 can be, but is not limited to be, hardware, firmware, instructions executing on a machine, and/or combinations thereof to perform a function(s) or an action(s), and/or to cause a function or action from another logic, method, apparatus, and/or system. Power on reset logic 240 can be a discrete logic (e.g., application specific integrated circuit (ASIC)), a digital circuit, a programmed logic device, a memory device containing instructions, and so on. Power on reset logic 240 can include one or more gates, combinations of gates, or other circuit components. Other "logics" described herein may take forms similar to those described in connection with power on reset logic 240.

Figure 3:
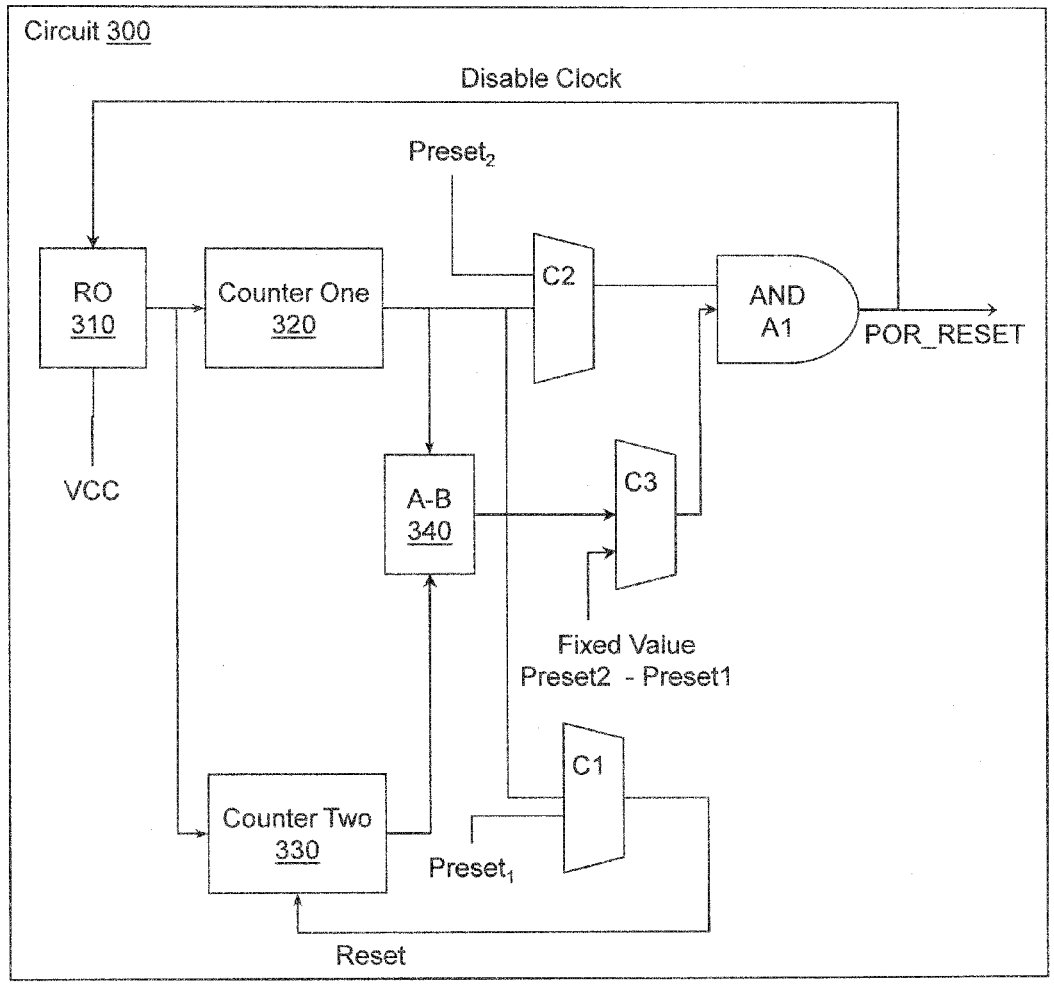
FIG. 3 illustrates a digital power on reset circuit.

One specific embodiment of apparatus 200 is illustrated by circuit 300 in FIG. 3. FIG. 3 illustrates a digital power on reset circuit 300. The circuit 300 includes a ring oscillator (RO) 310. The ring oscillator 310 is configured to receive an input voltage (e.g., Vcc) and to produce clock signals suitable for clocking digital circuit elements. The circuit 300 includes counter one 320 and counter two 330 which may be the same counters illustrated in FIG. 2. Both counter one 320 and counter two 330 will start counting at a random number. However, the circuit 300 is designed to assert a power on reset signal after a pre-determined period of time associated with at least a pre-determined number of clock signals being counted. Therefore, the circuit 300 includes additional elements that are configured to insure that the power on reset signal is not asserted until at least the pre-determined number of clock signals have been encountered. While a ring oscillator 310 is described, one skilled in the art will appreciate that other digital elements can produce a clock signal. Also, while two counters are illustrated, one skilled in the art will appreciate that other digital power on reset circuits could include two or more counters.

Counter one 320 outputs a count signal. This count signal is provided to a comparator C1. Comparator C1 compares the count signal to a first preset value Preset1. When comparator C1 determines that the count signal from counter one 320 equals the first preset value Preset1, comparator C1 resets counter two 330 to a known value (e.g., zero). Counter one 320 starts counting from any point in its range. When counter one 320 reaches the end of its range, counter one 320 will reset and continue counting. Counter one 320 can count up or can count down. Regardless of whether counter one 320 counts up or counts down, at some point the count signal from counter one 320 will equal the first preset value Preset1. If the random value at which counter one 320 starts counting is very close to Preset1, then only a small number of clock signals may have been counted before comparator C1 determines that the count signal from counter one 320 equals Preset1. This small number of clock signals can be less than the desired number of clock signals. If the random value at which counter one 320 starts counting is already beyond Preset1, then a large number of clock signals can be counted before comparator C1 determines that the count signal from counter one 320 equals Preset1. This large number of clock signals may be greater than the desired number of clock signals. Since counter one 320 starts counting at a random number in its count range, it is unknowable whether comparator C1 determined that the count signal from counter one 320 occurred after a desired number of clock signals was counted.

Therefore, the circuit 300 includes a second counter, counter two 330. Counter two 330 is reset when comparator C1 determines that the count signal from counter one 320 equals Preset1. Counter two 330 outputs a count signal that is provided to an A-B component 340. A-B component 340 accepts the count signal from counter one 320 and accepts the count signal from counter two 330 and outputs the difference between them. Before counter two 330 is reset, the difference will be the difference between the two random numbers at which counter one 320 and counter two 330 started counting. After counter two 330 is reset, the difference will be the value Preset1.

After reaching Preset1, counter one 320 continues to be clocked and continues to output a count signal. The count signal is provided to comparator C2. Comparator C2 compares the count signal to a second pre-determined value Preset2. Preset2 is selected as a function of Preset1. The difference between Preset1 and Preset2 is the pre-determined number of clock cycles associated with the pre-determined period of time for which components are to be held in reset and the pre-determined number of clock cycles after which the power on reset signal can be asserted. Comparator C2 outputs a Preset2 met signal upon determining that the count signal from counter one 320 equals Preset2. To guard against prematurely asserting the power on reset signal in the situation where counter one 320 started counting at a random number between Preset1 and Preset2, the circuit also includes an AND element A1. And element A1 will only assert the power on reset signal POR_RESET upon determining that comparator C2 indicates that counter one 320 has equaled Preset2 and that comparator C3 indicates that counter two 330 has been reset to zero when counter one 320 equaled Preset1. Comparator C3 determines that counter two 330 was reset to zero by comparing the current difference between counter one 320 and counter two 330 to the fixed difference between Preset1 and Preset2. When these two values are equal, comparator C3 knows that counter two 330 was reset when counter one 320 equaled Preset1.

The power on reset signal POR_RESET is fed back to the ring oscillator 310 to disable the ring oscillator 310. Therefore, the circuit 300 will only consume power while it is performing its power on reset function and will turn itself off after fulfilling that role. This is an improvement over conventional analog circuits that continue to draw power even after fulfilling their role.

Different devices can have different power on reset requirements. Therefore, in one example, the values of Preset1 and Preset2 can be user configurable. This facilitates making the circuit 300 configurable and portable to other devices. A greater difference between Preset1 and Preset2 will yield a longer power on reset delay while a smaller difference between Preset1 and Preset2 will yield a shorter power on reset delay.

In one embodiment, the circuit 300 includes a ring oscillator 310 that is configured to produce a square wave clock signal when a power signal available to the circuit 300 is at a pre-determined level. In the embodiment, the circuit 300 includes a first counter 320 that is configured to output a first count signal as a function of counting edges in the clock signal. It is unknown at what value the first counter 320 will begin. Therefore the circuit 300 includes a second counter 330 that is configured to output a second signal as a function of counting edges in the clock signal. It is also unknown at what value the second counter 330 will begin counting. Therefore the circuit 300 includes comparison components that are configured to selectively reset the second counter 330 to a second counter start value upon determining that the first count signal equals a first preset value and to provide a second comparison signal upon determining that the first count signal equals a second preset value.

Some portions of the detailed descriptions that follow are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations include physical manipulations of physical quantities. Usually, though not necessarily, the physical quantities take the form of electrical or magnetic signals capable of being stored, transferred, combined, compared, and otherwise manipulated in a logic, and so on. The physical manipulations transform electronic components and/or data from one state to another.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be used to implement an example methodology. Blocks may be combined or separated into multiple components. Furthermore, additional and/or alternative methodologies can employ additional, not illustrated blocks.

Figure 4:
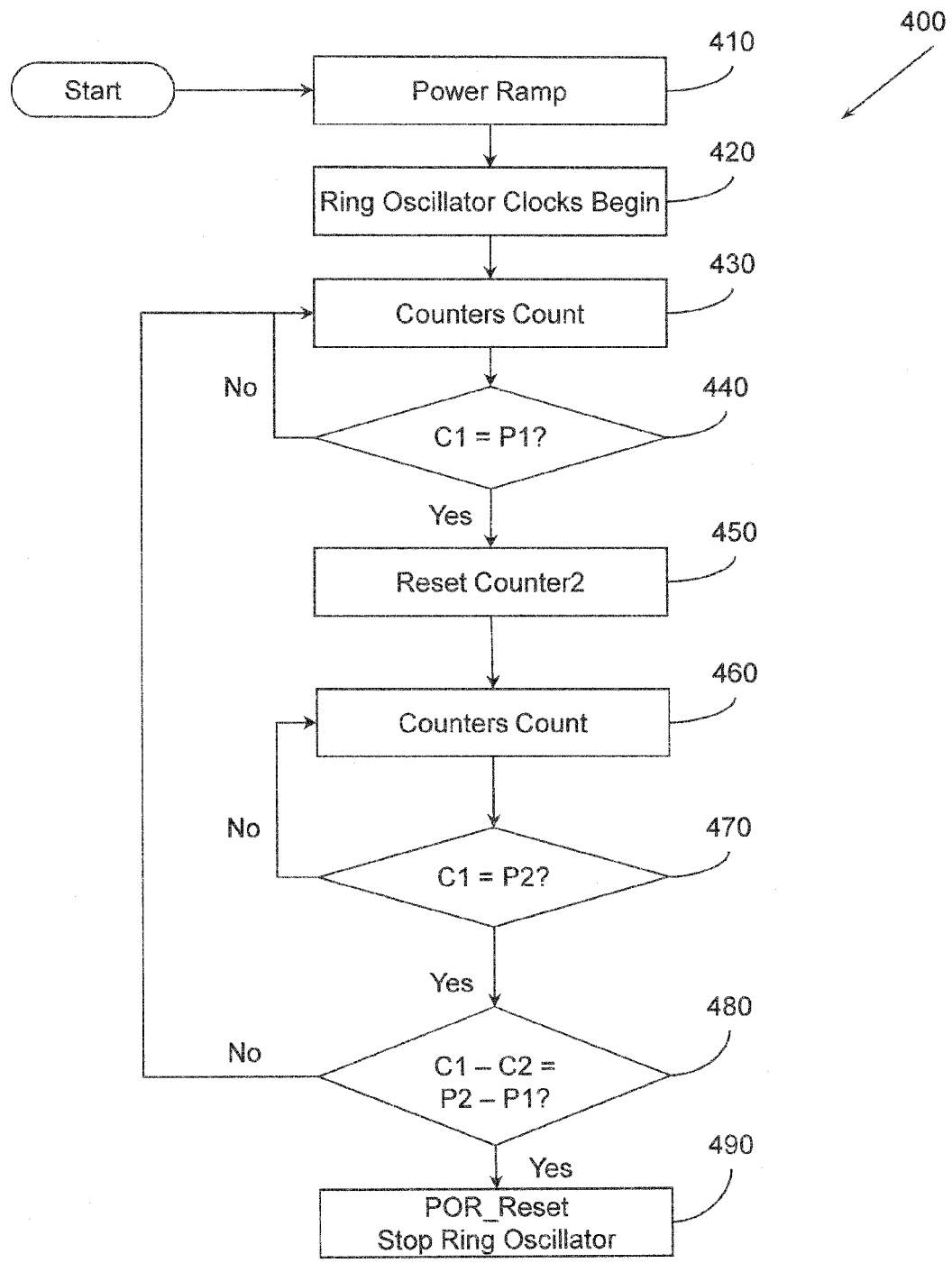
FIG. 4 illustrates a flow chart that describes a method associated with asserting a power on reset signal.

FIG. 4 illustrates a method 400. At 410, power begins ramping up when a device is turned on. At 420, after the power has ramped up to a first level, a ring oscillator begins producing clock signals. At 430, a set of counters begin counting the clock signals. In one embodiment, two counters can begin counting. In another embodiment, more than two counters can begin counting. At 440, a determination is made concerning whether a first counter value equals a first preset value. If the determination at 440 is No, that the first counter value does not equal the first preset value, then the counters simply continue to count. If the determination at 440 is Yes, that the first counter value does equal the first preset value, then, at 450, the second counter is reset to a known value (e.g., zero).

At 460, the counters continue to count. At 470, a determination is made concerning whether the first counter value equals a second preset value. If the determination at 470 is No, that the first counter value does not equal the second preset value, then the counters simply continue to count. If the determination at 470 is Yes, that the first counter value does equal the second preset value, then processing proceeds to 480.

At 480, a precautionary comparison is made. The precautionary comparison is made concerning whether the difference between the value of counter one and the value of counter two equals the difference between preset value 1 and preset value 2. This condition should only exist if at a first point in time counter one equaled preset value one and counter two was reset and if at a second later point in time counter one equaled preset value two. If the determination at 480 is Yes, then, at 490, the power on reset signal is asserted and the ring oscillator is disabled. If the determination at 480 is No, then an error has been detected and processing can return to 430.

More generally, method 400 performs the following actions. Method 400 detects a clock signal that indicates that a power signal has reached a desired level. Method 400 controls a second counter to be reset to a known value upon determining that a first counter has reached a first pre-determined value in response to analyzing the clock signal. Method 400 provides a power on reset signal upon determining that the first counter has reached a second pre-determined value after reaching the first pre-determined value. Method 400 also provides a disable signal to disable a power on reset circuit upon determining that the disable signal has been provided. The disable signal is configured to control a component that provides the clock signal. One skilled in the art will appreciate that method 400 and/or circuit 300 can be extended to include additional counters and counter actions. For example, a third counter could be added to circuit 300 along with additional comparison units and power on reset logic. Similarly, additional comparisons could be added to method 400, and additional counter resets could be performed based on the additional comparisons. By way of illustration, counter one 320 could reset counter two 330 and an additional counter (not illustrated) when counter one 320 has reached a pre-determined value. The third counter could then be used in a comparison that determines whether counter one 320 has reached a third pre-determined value after reaching a second pre-determined value associated with counter two 330.

Figure 5:
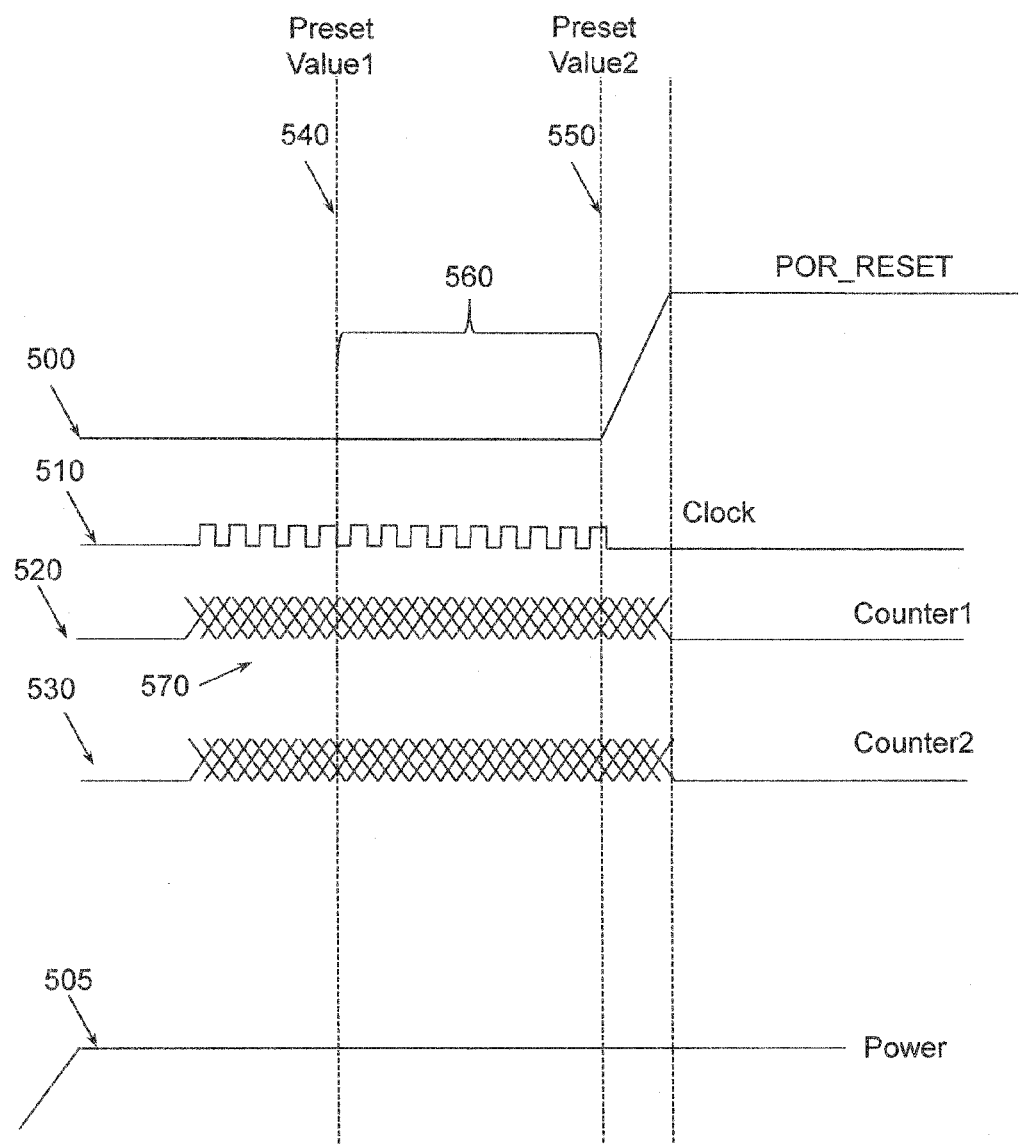
FIG. 5 illustrates a timing diagram associated with asserting a power on reset signal.

FIG. 5 illustrates a timing diagram associated with the circuit 300 illustrated in FIG. 3 and the method 400 illustrated in FIG. 4. The power on reset signal POR_RESET is illustrated on trace 500. A clock signal 510 and a power signal 505 are illustrated. The clock signal 510 begins when the power signal 505 reaches a level sufficient for the clock circuit to function. A power on reset delay period 560 is accounted for by counting a predetermined number of clock cycles between preset value2 550 and preset value1 540.

Both counter1 520 and counter2 530 can start at random counts. For example, counter1 520 could start at 570 with an initial value less than or equal to preset value 1. If counter1 520 starts at 570, then preset value1 540 is encountered first and power on reset proceeds normally. If counter1 520 starts with an initial value larger than preset value 1 540, then count1 520 will overflow and star over. This is no different logically than counter1 520 starting at 570, it will just take longer to reach preset value 1 540. Regardless of where counter1 520 begins counting, the circuit 300 illustrated in FIG. 3 and method 400 illustrated in FIG. 4 function to provide a power on reset delay period of at least the number of clocks representing the difference between preset value2 550 and preset value1 540. While the delay may be longer than desired, it will not be shorter than desired. Also, after the power on reset signal is asserted, the circuit 300 will be powered off.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclu-sive, and not the exclusive use. See, Bryan A. Garner, A Dictionary of Modern Legal Usage 624 (2d. Ed. 1995).

What is claimed is:

1. An apparatus comprising:
   a digital electronic component configured to produce a clock signal;
   a first counter configured to output a first count signal based on the clock signal;
   a second counter configured to output a second count signal based on the clock signal; and
   a power on reset logic configured to provide a power on reset signal based on the first count signal and the second count signal, wherein the power on reset logic is configured to disable the digital electronic component after providing the power on reset signal to prevent the digital electronic component from drawing power;
   wherein the power on reset logic is configured to generate the power on reset signal upon determining:
   that the first counter has counted to a first pre-determined value,
   that the first counter has reset the second counter to a second value,
   that the first counter has counted to the second value, and
   that a difference between a value of the first counter and a value of the second counter equals a pre-determined value at a point in time that the first counter has counted to the second value.

2. The apparatus of claim 1, wherein the apparatus is a digital electronic circuit.

3. The apparatus of claim 1, wherein the digital electronic component includes a ring oscillator.

4. The apparatus of claim 1, wherein the first counter includes a digital electronic counter configured to count clock edges in the clock signal.

5. The apparatus of claim 1, wherein the second counter includes a digital electronic counter configured to count clock edges in the clock signal.

6. A circuit comprising:
   a digital electronic component configured to produce a clock signal, wherein the digital electronic component is connected to an input voltage;
   at least two counters configured to output at least two count signals based on the clock signal, wherein the at least two count signals comprise a first count signal generated from a first counter and a second count signal generated from a second counter; and
   a power on reset logic configured to determine a difference between a value of the first count signal and a value of the second count signal;
   wherein the power on reset logic is configured to provide a power on reset signal after the difference between the at least two count signals meet a pre-defined condition;
   wherein the power on reset logic is configured to disable the digital electronic component after providing the power on reset signal to prevent the digital electronic component from drawing power from the input voltage after the power on reset signal is provided; and
   wherein the pre-defined condition is determined from:
   a first comparison component configured to provide a first comparison signal upon determining that the first count signal equals a first preset value, where the first comparison signal causes the second counter to be reset;
   a second comparison component configured to provide a second comparison signal upon determining that the first count signal equals a second preset value; and
   a third comparison component configured to provide a third comparison signal upon determining that the difference between the first count signal and the second count signal equals a difference between the first preset value and the second preset value, wherein the third comparison signal is used to determine if the pre-determined condition has been met.

7. The circuit of claim 6, wherein:
the first counter is configured to output the first count signal based on counting edges in the clock signal, wherein the first counter is configured to begin counting at a first count value; and
the second counter is configured to output the second count signal based on counting the edges in the clock signal, wherein the second counter is configured to begin counting at a second count value.

8. The circuit of claim 6, wherein the digital electronic component includes a ring oscillator configured to produce the clock signal when the input voltage is at a pre-determined level.

9. The circuit of claim 6, wherein the power on reset logic is configured to determine the pre-defined condition based on a relationship between values of the at least two count signals.

10. The circuit of claim 6, wherein the circuit being embodied in an application specific integrated circuit.

11. A method comprising:
generating a clock signal with a digital electronic component that is connected to an input voltage;
outputting, using at least two counters, at least a first count value and a second count value based on the clock signal;
determining a difference between the first count value and the second count value to determine if the difference meets a pre-defined condition;
providing a power on reset signal after the difference between the first count value and the second count value meets the pre-defined condition;
disabling the digital electronic component after providing the power on reset signal to prevent the digital electronic component from drawing power from the input voltage after the power on reset signal is provided;
controlling one or more counters, in addition to the at least two counters, to be reset to a known value upon determining that a first counter of the at least two counters has reached a first pre-determined value in response to analyzing the clock signal; and
wherein the power on reset signal is provided upon determining that the first counter has reached a second pre-determined value after reaching the first pre-determined value and that the first counter has reached a third pre-determined value after reaching the second pre-determined value.

12. The method of claim 11, wherein determining if the difference between the first count value and the second count value meets the pre-defined condition includes comparing the first count value and the second count value to identify the pre-defined condition determined from a relationship between values of the first count value and the second count value.

13. The method of claim 11, further comprising turning off the at least two counters after the power on reset signal is provided to prevent the at least two counters from drawing power from the input voltage.

* * * * *